United States Patent
Saka et al.

(10) Patent No.: US 9,972,751 B2
(45) Date of Patent: May 15, 2018

(54) METHOD FOR MANUFACTURING WAVELENGTH CONVERSION MEMBER

(71) Applicant: NICHIA CORPORATION, Anan-shi, Tokushima (JP)

(72) Inventors: Naoki Saka, Tokushima (JP); Jun Kawamata, Tokushima (JP); Isamu Niki, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days. days.

(21) Appl. No.: 14/947,006

(22) Filed: Nov. 20, 2015

(65) Prior Publication Data

US 2016/0149097 A1    May 26, 2016

(30) Foreign Application Priority Data

Nov. 21, 2014 (JP) .................. 2014-237047

(51) Int. Cl.
| | |
|---|---|
| *H01L 33/00* | (2010.01) |
| *H01L 33/50* | (2010.01) |
| *C23C 16/40* | (2006.01) |
| *C23C 16/44* | (2006.01) |
| *C23C 16/455* | (2006.01) |

(52) U.S. Cl.
CPC .......... *H01L 33/501* (2013.01); *C23C 16/403* (2013.01); *C23C 16/4417* (2013.01); *C23C 16/45525* (2013.01); *H01L 2933/0041* (2013.01)

(58) Field of Classification Search
CPC .......... H01L 2224/8592; H01L 31/055; H01L 2933/0041; H01L 33/501; C23C 16/45525; C23C 16/4417; H01J 61/44; H01J 9/223
See application file for complete search history.

(56) References Cited

U.S. PATENT DOCUMENTS

| | | | | |
|---|---|---|---|---|
| 2002/0140338 A1* | 10/2002 | Sluzky | .................. | H01J 29/18 313/461 |
| 2008/0238298 A1* | 10/2008 | Asai | .................. | C09K 11/615 313/503 |
| 2009/0091235 A1* | 4/2009 | Matsuo | .............. | C09K 11/7734 313/486 |

(Continued)

FOREIGN PATENT DOCUMENTS

| | | |
|---|---|---|
| JP | 2007-048864 A | 2/2007 |
| JP | 2011-068971 A | 4/2011 |

(Continued)

*Primary Examiner* — Mohsen Ahmadi
*Assistant Examiner* — Frederick B Hargrove (57) ABSTRACT

A method for manufacturing a wavelength conversion member includes: forming a phosphor layer on a base body including phosphor particles and oxide particles affixed to surfaces of the phosphor particles; and forming a cover layer covering the surfaces of the phosphor particles and surfaces of the oxide particles continuously, and having a same oxide material as the oxide particles. A wavelength conversion member includes: a base body, a phosphor layer disposed on the base body and including phosphor particles and oxide particles affixed to surfaces of the phosphor particles; and a cover layer covering the surfaces of the phosphor particles and surfaces of the oxide particles continuously, and including a same oxide material as the oxide particles.

12 Claims, 4 Drawing Sheets

(56) References Cited

U.S. PATENT DOCUMENTS

| | | | | |
|---|---|---|---|---|
| 2011/0304264 A1* | 12/2011 | Winkler | ............ | C09K 11/7734 313/504 |
| 2013/0257264 A1* | 10/2013 | Tamaki | ................... | B05D 5/06 313/503 |
| 2014/0293609 A1* | 10/2014 | Daimon | ............... | H01L 33/504 362/293 |
| 2015/0159836 A1 | 6/2015 | Tamaki et al. | | |

FOREIGN PATENT DOCUMENTS

| | | |
|---|---|---|
| JP | 2013-203822 A | 10/2013 |
| JP | 2014-135400 A | 7/2014 |

* cited by examiner

METHOD FOR MANUFACTURING WAVELENGTH CONVERSION MEMBER

CROSS-REFERENCE TO RELATED APPLICATIONS

This application claims priority to Japanese Patent Application No. 2014-237047 filed on Nov. 21, 2014. The entire disclosure of Japanese Patent Application No. 2014-237047 is hereby incorporated herein by reference.

BACKGROUND

1. Field of the Invention

The present invention relates to a wavelength conversion member, to a method for manufacturing this member, and to a light emitting device.

2. Description of Related Art

Light emitting diodes, semiconductor lasers, and other such semiconductor light emitting elements are used in a variety of light emitting devices and lighting devices. For instance, they have been used in light sources that need to have high output, such as headlights and projectors.

With such a light emitting device, a wavelength conversion member is used to convert the color of the light emitted from the light emitting element. For example, a wavelength conversion member can be in the form of a phosphor wheel used in a projector, which is composed of a phosphor and a resin, and which mainly makes use of a phosphor layer in which a phosphor is fixed with a silicone resin.

With a phosphor layer such as this, however, a higher load or output of the incident light source can cause the resin to deteriorate, and an inorganic phosphor layer that contains no organic substance has been proposed.

In light of this situation, in addition to high light resistance, there is a need for higher added value, such as cost advantages realized through simple manufacture, good wavelength conversion characteristics, and a reduction in the size of the wavelength conversion member itself.

SUMMARY

The present invention was conceived in light of the above problems, and one object is to provide a wavelength conversion member with which there are no limitations on the type of phosphor used, and which is more compact and can be obtained by a simple method, as well as a method for manufacturing this member, and a light emitting device including such a wavelength conversion member.

One aspect of the present invention provides a wavelength conversion member in which adhesion is improved between the phosphor particles and between the phosphor particles and the base body.

The method for manufacturing the wavelength conversion member of the present disclosure includes: forming a phosphor layer on a base body, the phosphor layer including phosphor particles and oxide particles affixed to surfaces of the phosphor particles; and forming a cover layer covering the surfaces of the phosphor particles and surfaces of the oxide particles continuously, and having a same oxide material as the oxide particles.

The wavelength conversion member of the present disclosure includes: a base body; a phosphor layer disposed on the base body and including phosphor particles and oxide particles affixed to surfaces of the phosphor particles; and a cover layer covering the surfaces of the phosphor particles and surfaces of the oxide particles continuously, and including a same oxide material as the oxide particles.

The light emitting device of the present disclosure includes: a light emitting element, and the wavelength conversion member as described above disposed so as to cover a light emission face of the light emitting element.

According to one embodiment of the wavelength conversion member of the present disclosure, it is possible to provide a wavelength conversion member in which adhesion is improved between the phosphor particles and between the phosphor particles and the base body.

According to one embodiment of the method for manufacturing the wavelength conversion member of the present disclosure, it is possible to provide the manufacturing method of the wavelength conversion member in which adhesion is improved between the phosphor particles and between the phosphor particles and the base body.

DETAILED DESCRIPTION OF THE EMBODIMENT

Embodiments for implementing the light emitting device of the present invention will be described below with reference to the accompanying drawings. In the following embodiment of the light emitting device that embody the technological concept of the present invention are just examples, and unless otherwise specified, the constituent parts discussed in the embodiments are not intended to limit the scope of the present invention. Further, constitutions described in examples and the embodiments can be employed in other examples and embodiments.

The sizes and the arrangement relationships of the members in each of drawings are occasionally shown exaggerated for ease of explanation.

Method for Manufacturing Wavelength Conversion Member

A wavelength conversion member can basically be manufactured by forming a phosphor layer on a base body, and forming a cover layer.

Formation of Phosphor Layer

First, a phosphor layer is formed over a base body.

Base Body

The base body is a support member for supporting the phosphor layer. There are no particular restrictions on the shape, but examples include a board having a flat or curved face, and shapes in which there is texturing on the surface of the board. There are no particular restrictions on the material or structure of the base body, but it will preferably be reflective or light-transmissive, or will be light-transmissive to a certain wavelength and will be reflective to other wavelengths. The term "reflective" here means, for example, that the reflectivity to incident light is at least 60%, preferably at least 75%, and more preferably at least 90%. The term "light-transmissive" here means that at least 60%, preferably at least 75%, and more preferably at least 90% of the light incident on the wavelength conversion member (first color light) and of the light whose wavelength has been converted by the wavelength conversion member (second color light) will be transmitted. The phrase "light-transmissive to a certain wavelength and reflective to other wavelengths" here means that at least 60%, preferably at least 75%, and more preferably at least 90% of the light incident on the wavelength conversion member (first color light) will be transmitted, and at least 60%, preferably at least 75%, and more preferably at least 90% of the light whose wavelength has been converted by the wavelength conversion member (second color light) will be reflected, or that at least 60%, preferably at least 75%, and more preferably at least 90% of the light incident on the wavelength conversion member (first color light) will be reflected, and at least 60%, preferably at least 75%, and more preferably at least 90% of the light whose wavelength has been converted by the wavelength conversion member (second color light) will be transmitted.

Examples of such materials include Al (aluminum), Cu (copper), Ag (silver), other metal which is solid at a temperature in the step of forming the coating layer as described later, and an alloy thereof, glass, crystal, oxide (such as $Al_2O_3$, $SiO_2$, $ZrO_2$, $HfO_2$, $TiO_2$, $ZnO$, $Ta_2O_5$, $Nb_2O_5$, $In_2O_3$, $SnO_2$), nitrides (such as AlN, GaN), carbides (such as SiC), oxide which contain at least one element selected from In, Sn and Mg (such as ZnO, AZO (Al-doped ZnO), IZO (In-doped ZnO), GZO (Ga-doped ZnO), $In_2O_3$, ITO (Sn-doped $In_2O_3$), IFO (F-doped $In_2O_3$), $SnO_2$, ATO (Sb-doped $SnO_2$), FTO (F-doped $SnO_2$), CTO (Cd-doped $SnO_2$), MgO), fluoride (such as $CaF_2$, $BaF_2$, $MgF_2$, LiF, $SrF_2$, $LaF_3$). These may be used singly, or a combination of two or more types may be used, as a single-layer structure including two or more types of phosphor particles and one type of oxide particles, as a single-layer structure, laminated structure or a composite structure in which all or a part of the material in-plane direction is different.

A reflective base body does not need to be entirely formed from metal, glass, a single crystal, a polycrystal, or a sinter, and may be configured, for example, so that a metal layer and/or a dielectric multilayer film is provided on, under, around, etc., the base body made of glass, crystal, sapphire, an inorganic compound, highly thermally conductive carbon, diamond, or the like.

A light-transmissive base body does not need to be entirely formed from light-transmissive glass, a single crystal, a polycrystal, or a sinter, and may be configured so that a dielectric laminar structure is provided on, under, around, etc., the base body such as ones described above.

A base body that is light-transmissive to a certain wavelength and reflective to other wavelengths does not need to be entirely formed from light-transmissive glass, a single crystal, a polycrystal, or a sinter, and may be configured as a compound structure in which a dielectric laminar structure is provided on, under, around, etc., the base body made of the light-transmissive substance.

The base body is preferably made of a material with high thermal conductivity so that heat generated by Stokes shift in the light that has undergone wavelength conversion by the phosphor layer. More specifically, the material used for the base body preferably has a thermal conductivity of at least 5 W/m·K.

Phosphor Layer

The phosphor layer includes phosphor particles. These phosphor particles preferably have oxide particles affixed to their surface. The phosphor particles may themselves constitute an aggregate, in which case it is again preferable for oxide particles to be affixed uniformly or substantially uniformly to the surface thereof. Individual phosphor particles to whose surface oxide particles have adhered may clump together to form an aggregate. That is, the phosphor particles may be in direct contact with each other, but preferably they are in contact via oxide particles. The oxide particles will act as a binder between the phosphor particles themselves and between the phosphor particles and the base body, allowing these to be fixed together more securely.

Phosphor Particles

The phosphor used in the phosphor particles can be any known type. For instance, the ones listed as examples in Japanese Laid-Open Patent Applications 2013-203822 and 2014-135400 can be used. Examples include yttrium-aluminum-garnet (YAG)-based phosphors activated by cerium, lutetium-aluminum-garnet (LAG)-based phosphors activated by cerium, silicate $((Sr, Ba)_2SiO_4)$-based phosphors activated by europium, oxynitride-based phosphors such as β-sialon and α-sialon phosphors, $Ba,Sr,Ca)_2Si_5N_8$:Eu-based phosphors, nitride-based phosphors such as CASN-based or SCASN-based phosphors, KSF-based phosphors ($K_2SiF_6$:Mn) and sulfide-based phosphors. Further, examples of the phosphor include a luminescent material referred to as a so called nanocrystal or quantum dot, which is nano-size high-dispersive particles of semiconductor materials, for example group II-VI, group III-V and group IV-VI semiconductors, more specifically CdSe, core-shell type $CdS_xSe_{1-x}/ZnS$, GaP, InP, and GaAs, and the quantum dot phosphors. These may be used singly, or a combination of two or more types may be used. It is particularly preferable to use a material that absorbs from ultraviolet light to blue light, and emits from blue light to red light.

The phosphor particles preferably have an average size of about 0.1 to 50 µm, more preferably about 0.1 to 30 *µm, and still more preferably about* 0.1 to 10 µm for example. Because the shape of the particles is not uniform, the size of the phosphor particles here may be the major axis diameter, minor axis diameter, unidirectional diameter, equivalent diameter (image analysis method, shading method, Coulter method), effective diameter (settling method, laser diffraction/scattering method), or any other such particle size. Also, it may be the average of any of these particle sizes. The average particle size can be measured and calculated with a commercially available particle measurement device or particle size distribution measurement device. For example, it can be the particle size obtained by air permeability method in the F.S.S.S. No. (Fisher Sub-Sieve Sizer Number) (a value expressed by so-called D bar (a bar over a D)).

When the above-mentioned median diameter D-bar and Dm/D-bar, which is the ratio of the median particle diameter measured with a laser diffraction type of particle size distribution measurement device (such as the SALD series made by Shimadzu Corp) or an electrical resistance type of particle size distribution measurement device (such as a Coulter counter made by Beckman Coulter), are an index of the dispersibility of the phosphor particles, this index value is preferably close to 1. The closer the index value is to 1, the higher will be the dispersibility of the particles, and the less stress will be in the phosphor layer that is formed. Consequently, cracking can be suppressed in the phosphor layer.

The phosphor particles preferably have an average size of 0.1 to 50 μm, and the size of at least 50% of the particles, by the total weight of the phosphor particles being used, is at least 1 μm.

Using phosphor particles such as these allows internal scattering to be suppressed, and also allows the optical transmissivity to be increased. Suppressing internal scattering allows the light distribution component to be increased in the direction perpendicular to the upper surface, and at the same time suppresses light heading toward the side surfaces or the lower surface. This further improves the light extraction efficiency.

Oxide Particles

The oxide particles adhere to the surface of the phosphor particles. The term "surface" here means that before the phosphor layer is formed, while it is being formed, or after it has been formed (and particularly after it has been formed), the oxide particles adhere uniformly or substantially uniformly in the three-dimensional directions (left, right, up, and down) of the phosphor particles.

The oxide particles are preferably made of a light-transmissive material. As a result, light will not be absorbed, and wavelength conversion efficiency and so forth will not be reduced. Example the oxide particle include at least one of $Al_2O_3$, $SiO_2$, $ZrO_2$, $HfO_2$, $TiO_2$, $ZnO$, $Ta_2O_5$, $Nb_2O_5$ and $In_2O_3$, $SnO_2$, among these, $Al_2O_3$ and $SiO_2$ are preferred, and $Al_2O_3$ is more preferred.

The oxide particles preferably have a smaller particle size than the phosphor particles. For example, the average size of the oxide particles may be about 1 nm to 5 μm, preferably about 1 nm to 3 μm, and more preferably about 1 nm to 1 μm. The "particle size" referred to here may be any of those mentioned for the size of the phosphor particles, and may be any of those average particle sizes. It is especially preferable for the oxide particles to be nano particles. This ensures the proper surface area for adhesion to the surface of the phosphor particles and/or the base surface, and improves the adhesion between the phosphor particles themselves and between the phosphor particles and the base body. Also, since the particles adhere over a larger surface area, thermal conduction can be increased.

The "particle size" here refers to the particle size that accounts for at least 50% of the oxide particles contained in a phosphor layer of a particular volume (such as several cubic millimeters), and is preferably the particle size that accounts for at least 60%, more preferably the particle size that accounts for at least 70%, and still more preferably the particle size that accounts for at least 80%. The particle size can be measured by electron microscope, SEM observation, or the like.

The average particle size of the oxide particles is from 1 nm to 5 μm, and preferably the size of at least 50% of the particles, as the total weight of the phosphor particles being used, is at least 1 nm.

Other Components

The phosphor layer may contain an inorganic filler or the like. For example, adding an inorganic filler with a high refractive index will scatter and diffuse light incident on the phosphor layer and light converted by the phosphor, promote the mixing of light, and eliminate color unevenness. Adding an inorganic filler with high thermal conductivity will improve heat dissipation by allowing heat generated by Stokes shift to be conducted efficiently to the base body. The shape of the void part of the phosphor layer, the proportion of this void, the textural shape of the surface of the phosphor layer, and so forth can be adjusted by adding an inorganic filler.

Examples of inorganic fillers with high refractive index include $TiO_2$, $Ta_2O_5$, $Nb_2O_5$ and $ZrO_2$ and other such oxides, SiC and diamond. Examples of inorganic fillers with high thermal conductivity include AlN, GaN, and other such nitrides, SiC, and diamond. These can be used singly or in combinations of two or more types. The inorganic filler can have about the same particle size as that of the phosphor particles.

Formation Method

To form the phosphor layer, first the phosphor particles and oxide particles are mixed into an organic solvent and a resin to prepare a paste, the base body is coated with this paste, and then the organic solvent and the resin are removed.

There are no particular restrictions on the organic solvent and resin used here. The organic solvent can be butyl carbitol acetal or the like, for example. The resin can be ethyl cellulose, an acrylic resin, or the like, for example.

Drying and sintering are performed in the removal of the organic solvent, but first drying is performed to vaporize (evaporate) any liquid component other than the ethyl cellulose, for example. Here, the phosphor is temporarily fixed to the base body by the resin. After this, sintering is performed to burn off and decompose the solid component, such as ethyl cellulose.

The phosphor particles and oxide particles mixed here are preferably mixed in a weight ratio of 1:0.01 to 0:1, and more preferably 1:0.01 to 0.02.

There are no particular restrictions on the amount in which the organic solvent and resin are used, which can be suitably adjusted according to the method for coating the base body, etc. For instance, the mixture will preferably exhibit 1 to 15 Pa·s as measured with an E-type viscometer.

The method by which the base body is coated with the paste can be printing, dispenser coating, inkjet, potting, transfer molding, compression molding, spray coating, or the like. Printing can be used to particular advantage.

After the organic solvent has been removed, sintering is performed. This sintering removes substantially all of the resin adhering to the surface of the phosphor particles and oxide particle on the base body. The sintering can be performed, for example, by heating the base body to at least 300° C., and preferably at least 400° C. In particular, with a red phosphor (CASN) or other such phosphor particles, the temperature is preferably no higher than 500° C. As a result of this sintering, only the phosphor particles and the oxide particle end up being disposed on the base body.

This sintering of the base body is performed after the formation of the phosphor layer and before the formation of the cover layer.

The phosphor particles and the base body have weak adhesion or binding, and impact or the like during the manufacturing process can lead to loss, separation, etc., of the phosphor particles. However, as discussed above, since the oxide particles are distributed and adhere to the surface of the phosphor particles, the oxide particles increase the contact surface area between the base body and the phosphor particles, and effectively act as a binder, which effectively prevents the loss, separation, etc., of the phosphor particles due to impact or the like during the manufacturing process. As a result, the adhesion or binding of the phosphor particles to the base body can be strengthened, and this improves the durability of the phosphor layer.

In the phosphor layer that is formed, there will also be portions where the phosphor particles are in contact with each other, but for the most part, the phosphor particles will be touching or affixed via the oxide particles, and there may be voids between the phosphor particles. Also, unevenness attributable mainly to the phosphor particles are formed on the surface of the phosphor layer. Consequently, the light that is incident on the phosphor layer is scattered by the voids and/or surface unevenness, and can be efficiently absorbed by the phosphor particles contained in the phosphor layer. Also, the total reflection at the phosphor layer surface can be reduced, allowing light to be efficiently extracted from the phosphor layer.

This phosphor layer preferably has a thickness of about 1 to 200 μm at the thickest part of the film, and more preferably about 1 to 150 μm at the thickest part of the film. Also, the thickness is preferably about 2 to 5 times the particle size of the phosphor particles, and more preferably about 3 to 4 times. The thickness of this phosphor layer can be measured with a scanning electron microscope or the like. Thus adjusting the thickness allows the light incident on the wavelength conversion member to be efficiently converted to another wavelength, and allows for highly efficient light emission.

The phosphor layer may be formed as a single-layer structure including one type of phosphor particles and one type of oxide particles, or as a single-layer structure including two or more types of phosphor particles and one type of oxide particles, or as a single-layer structure including one type of phosphor particles and two or more types of oxide particles, or as a laminated structure including two or more types of phosphor particles and two or more types of oxide particles. In the case where the phosphor layer has a laminated structure, the boundary between layers may not necessarily be distinct. In the case where two or more types of laminated structure are formed from two or more types of phosphor particles, the thickness at the thickest part of the film is preferably about 1 to 200 μm.

The phosphor layer may be disposed over the entire surface of the base body, or may be disposed only in a certain region. In the latter case, a known masking method can be employed, such as the masking step discussed in Japanese Laid-Open Patent Application 2013-203822, for example.

Formation of Cover Layer

A cover layer is formed over the phosphor layer and the base body. The cover layer covers the surface of the phosphor particles. It preferably covers the surface of the phosphor particles and the oxide particles continuously, and more preferably it continuously covers the surface of the base body where no phosphor particles or oxide particles are disposed, the surface of the phosphor particles, and the oxide particles. The cover layer functions as a protective layer for the phosphor particles, as a binder that strengthens the adhesion of the phosphor particles to the oxide particles or the base body, and as a thermal conduction pathway.

The cover layer is preferably formed from an inorganic material, and more preferably is formed from a material that contains no organic material.

The material of the cover layer preferably contains the same oxide as the oxide particles that make up the phosphor layer, for example, and more preferably is composed only of the same oxide as the oxide particles that make up the phosphor layer. Thus using the same oxide material eliminates the difference in refractive index between the two, and prevents unnecessary scattering. As a result, the light extraction efficiency can be improved, and the orientation can be adjusted. Also, because the same coefficients of thermal expansion will be obtained, any separation or the like between the two that would otherwise be caused by this difference can be effectively prevented.

There are no particular restrictions on how the cover layer is formed, and any method that is known in this field can be used. Examples thereof include ALD (Atomic Layer Deposition), sol-gel method, MOCVD (metalorganic chemical vapor deposition), PECVD (plasma-enhanced chemical vapor deposition), CVD, atmospheric-pressure plasma film-forming method, spattering and deposition. Forming the layer by ALD or sol-gel method is preferred.

ALD forms a very solid film, and allows a film to be formed all the way to the rear surface of what is being covered, which is impossible with sputtering, vapor deposition, PECVD, or other such film formation methods. It also allows the film to be formed in a uniform thickness. Even though a cover layer formed by ALD is thin, it will still cover the phosphor particles well, and will be able to integrally cover the base body and an aggregate of the phosphor particles and the oxide particles. Therefore, Stokes heat generation that is caused by the phosphor particles can be quickly conducted through the thin cover layer to the base body. This allows a wavelength conversion member with excellent heat dissipation performance to be formed. Also, forming a film by ALD can be performed at a lower temperature than with other methods. Therefore, it can be used to particular advantage when producing a phosphor layer in which phosphor particles with low heat resistance are used.

With ALD, the cover layer can be laminated at the atomic layer level by performing the basic cycle of film formation a single time. Accordingly, the thickness of the cover layer can be freely controlled according to the number of cycles executed. Also, since the cover layer is laminated at the atomic layer level, there is good coverage of steps (such as texture shapes), and a film that has extremely few pinholes, is very solid, and has a uniform thickness can be formed. Forming the cover layer in the proper thickness allows the proper amount of voids to be present in the phosphor layer, without completely filling in all the gaps between phosphor particles and/or the oxide particles.

When the cover layer is formed by ALD, the raw material thereof can be a metal halide, an organometallic material, or the like that has a vapor pressure between normal temperature and 300° C. A cover layer composed of $Al_2O_3$ and formed by ALD is particularly preferable because it will have good barrier properties with respect to water vapor and other such atmospheres. TMA (trimethylaluminum) and water can be used as raw materials for forming an $Al_2O_3$ film.

After the cover layer has been formed by ALD, the resulting base body may be heated in an oven, for example.

The average thickness of the cover layer is preferably about 1 nm to 50 μm, for example. To reduce absorption by the cover layer, 1 μm or less is preferable, and to increase adhesive strength and thermal conductivity in the cover layer, at least 1 μm is preferable. With a thin film such as this, the surface of the cover layer will have a textured shape attributable at least to the phosphor layer. This reduces the total reflection at the cover layer surface, and allows light to be efficiently extracted from the phosphor layer.

The cover layer is preferably formed as a single layer from one of the above-mentioned types of material, but may instead be a single layer or a multilayer structure made of two or more types. When the layer is formed by a multilayer structure, a solid layer may be formed by ALD as a layer that touches the phosphor particles or the oxide particles, and another layer formed by ALD using a different material, or a layer may be formed by ALD as a layer that touches the phosphor particles or the oxide particles, and then a film formed by a fast film formation method such as PECVD, atmospheric-pressure plasma film formation, or the like.

Another film formation method besides ALD is the sol-gel method, in which a precursor that will become the material of the film is dissolved, the resulting solution is applied in a thin coating over the object to be coated by dip coating, spraying, spin coating, or another such method, this is made into a colloidal solution by hydrolysis polycondensation, and then this is made into a gel in a sintering step. The solution can work its way in between the particles, so the film can be formed all the way to the rear surface of the object being covered, which is impossible with sputtering, vapor deposition, PECVD, and other such film formation methods.

The thickness of a film formed by sol-gel method, and the thickness distribution, will vary with the coating method. Spin coating will produce a thinner film the higher is the rotational speed, and dip coating will produce a thinner film the faster is the pull-up rate. It is also possible to increase the film thickness by repeating coating and drying, and then sintering.

$SiO_2$ and $Al_2O$ are preferable as the film formed by sol-gel method, with $SiO_2$ being particularly good. When an $SiO_2$ film is formed by sol-gel method, tetraethoxysilane, alkylsilane, or another such silane material can be used as the solvent. The temperature required to gel these materials is around 500° C., which means that formation is possible at a low temperature.

With a thin film such as this, the surface of the cover layer will have a textured shape attributable at least to the phosphor layer. This reduces the total reflection at the cover layer surface, and allows light to be efficiently extracted from the phosphor layer. Also, the phosphor particles are bound together more securely, which improves the durability of the resulting wavelength conversion member.

Wavelength Conversion Member

The wavelength conversion member disclosed herein mainly inclues the above-mentioned base body, phosphor layer, and cover layer. With this wavelength conversion member, an aggregate of phosphor particles and oxide particles (that is, the phosphor layer) is disposed integrally, so as to continuously cover with the cover layer. Unevenness attributable to the phosphor layer are formed on the surface of the cover layer. Consequently, total reflection at the surface can be prevented, and light can be extracted more efficiently.

Other Layers

The wavelength conversion member is optionally configured such that a reflective layer (a metal layer, a dielectric multilayer film, etc.), a protective layer, a light-transmissive layer, an anti-reflection film, and the like are laminated or disposed at the desired positions, such as on the phosphor layer side of the base body, or the opposite side.

An example of a reflective layer is a metal layer or a dielectric multilayer film whose reflectivity with respect to light that is incident on the phosphor layer and to light that has undergone wavelength conversion at the phosphor layer is higher than that of the material constituting the base body. Examples of such a metal layer include a layer made of a metal with high reflectivity, particularly in the visible light band, such as aluminum or silver, or of an alloy of these metals. The metal reflective layer may be a single layer, a laminar structure, or a combination with a dielectric multilayer film. Providing this reflective layer produces a reflection type of wavelength conversion-use formation member in which light incident from the cover layer side undergoes wavelength conversion at the phosphor layer, and light that is reflected upward at the reflective layer and subjected to wavelength conversion is emitted.

The protective layer or light-transmissive layer may be a single layer or a multilayer structure made of a dielectric. The dielectric can be suitably selected from those discussed above. In particular, when a multilayer structure is used, it is preferably one that allows for adjustment of the transmission and reflection of light of a particular wavelength. For instance, in the case where it is a multilayer structure adjusted so that all or part of the light incident on the phosphor layer is transmitted, and all or part of the light that has undergone wavelength conversion at the phosphor layer is reflected, the result will be a transmission type of wavelength-use formation member in which light that is incident from the opposite surface where the phosphor layer is formed on the multilayer structure of the light-transmissive base body will be transmitted, and light converted at the phosphor layer is reflected and emitted.

These layers can be formed by any method that is known in this field, such as sputtering, vapor deposition, various kinds of CVD, various kinds of PVD, ALD, and so forth.

In the case where the wavelength conversion member has a protective layer, a light-transmissive layer, or a reflective layer from the upper surface of the base body, the thickness up to the top surface including these is preferably about 10 to 300 μm.

With this wavelength conversion member, since the phosphor layer in particular contains not only phosphor particles but also oxide particles that are bonded to the surface of the phosphor particles, adhesion can be improved between the phosphor particles themselves and between the phosphor particles and the base body via the oxide particles. Also, because these particles are included, there are voids within the phosphor layer, and light incident on the wavelength conversion member is scattered by the voids in the phosphor layer, and efficiently emitted by the phosphor particles. Therefore, the incident light is efficiently excited by the phosphor particles, and an increase in fluorescent output is obtained.

A second cover layer with a higher thermal conductivity than the first cover layer may further be provided to the surface of the cover layer. The second cover layer with high thermal conductivity allows the phosphor layer to be cooled more efficiently. The material with high thermal conductivity is preferably light-transmissive, examples of which include AlN, GaN, and other such nitride materials. AlN is particularly preferable. These layers can be formed by any method that is known in this field, such as sputtering, vapor deposition, various kinds of CVD, various kinds of PVD, and ALD.

There are no particular restrictions on the shape of the wavelength conversion member, and this shape can correspond to the shape of the light emitting element. In an embodiment, the wavelength conversion member preferably has a shape that constitutes a color wheel such as that discussed in Japanese Laid-Open Patent Application 2013-203822, for example. A color wheel is a disk that can rotate around a rotary shaft. The color wheel is divided into a plurality of parts centered on the rotary shaft, and each of these segments is configured as a reflecting member or a transmitting member as a site having a wavelength conversion function. Consequently, as the color wheel turns, light whose wavelength has been converted by the wavelength conversion member and light with the originally used wavelength are periodically outputted, or are mixed and outputted.

Light Emitting Device

The light emitting device disclosed herein mainly includes a light emitting element and the above-mentioned wavelength conversion member.

Light Emitting Element

The light emitting element can be, for example, an LED (light emitting diode), an LD (laser diode), or the like, which are semiconductor light emitting elements. There are no particular restrictions on the element structure or the semiconductor material used in the semiconductor light emitting element, and any one that is known in this field can be used. It is particularly preferable to use a semiconductor light emitting element in which gallium nitride or another such nitride semiconductor is used, because the resulting element will emit light with high brightness over a wavelength band from ultraviolet light to blue light.

Wavelength Conversion Member

As the wavelength conversion member, the above-mentioned wavelength conversion member is disposed so as to cover all or part of the light emission face of the light emitting element.

Coverage of the light emitting face of the light emitting element by the wavelength conversion member can be such that the wavelength conversion member is in contact with the light emitting element, or is not in contact, with another member interposed between them.

Providing the above-mentioned wavelength conversion member allows the phosphor particles in the phosphor layer to convert the light from the light emitting element into light having an emission spectrum of yellow, red, green, or blue, or a yellow, blue-green, orange, or the like that is an intermediate color of these. Therefore, the light having these emission spectrums can be used singly, or as a combination of two or more types, to create a light emitting device having a variety of emission colors.

For example, a semiconductor light emitting element based on a GaN or InGaN compound that emits blue light can be used to obtain a light emitting device that irradiates a phosphor of $Y_3Al_5O_{12}$:Ce or $(Y_{0.8}Gd_{0.2})_3Al_5)_{12}$:Ce and performs wavelength conversion, and that emits white light by mixing the light from the light emitting element with the light from the phosphor. Also, a semiconductor light emitting element that emits light of a wavelength in the near-ultraviolet band can be used to provide a light emitting device that emits white light with excellent color rendering by using three types of phosphor: $CaSi_2O_2N_2$:Eu or $SrSi_2O_2N_2$:Eu that emits green to yellow light, $(Sr,Ca)_5(PO_4)_3Cl$:Eu that emits blue light, and $Ca_2Si_5N_8$:Eu or $CaAlSiN_3$:Eu that emits red light. Because this makes use of red, blue, and green, which are the three primary colors of light, the desired white light can be obtained merely by changing the blend ratio of the phosphor.

Other Members

The light emitting device may includes optical members that suitably converge, diffuse, or reflect the light emitted by the light emitting element. Lenses of various shapes are examples of these members.

A sub-mount may be provided as a mounting board for mounting the light emitting element. The sub-mount may be a flat board, or it may have a recess that opens upward for installing the light emitting element.

Embodiment 1: Wavelength Conversion Member

Figure 1:
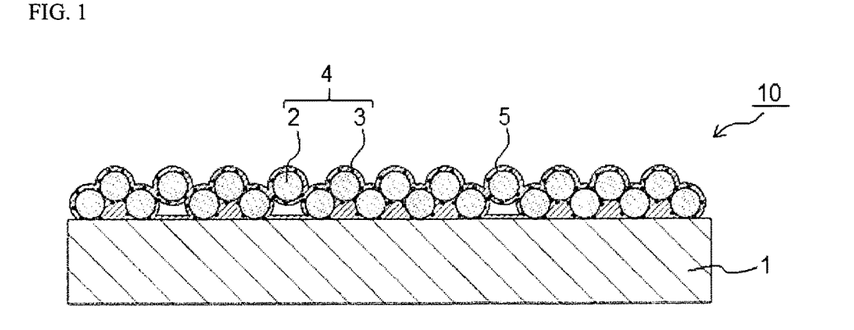
FIG. 1 is a schematic cross section illustrating the configuration of an embodiment of a wavelength conversion member of the present invention.

As shown in FIG. 1, the wavelength conversion member 10 in this embodiment has a base body 1, a phosphor layer 4 formed over the entire surface of the base body 1, and a cover layer 5 formed over the phosphor layer 4.

The base body 1 is a flat base body composed of sapphire and having a thickness of 0.7 mm.

The phosphor layer 4 is mainly composed of phosphor particles 2 and oxide particles 3.

The phosphor particles 2 are composed of a CASN phosphor, and have a size (the value expressed by so-called D bar (a bar over a D)) of 7 μm, which is measured by air permeability method in the F.S.S.S. No. (Fisher Sub-Sieve Sizer Number).

The oxide particles 3 are composed of alumina, and the average particle size is 20 nm.

On the base body 1, the phosphor layer 4 has a thickness of 50 μm, for example, at the thickest part.

Figure 7A:
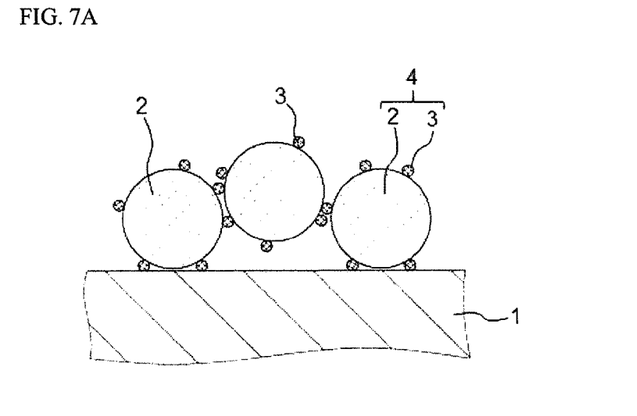
FIGS. 7A and 7B are schematic partial enlarged cross sections of the wavelength conversion member in FIG. 1.

In the phosphor layer 4, the oxide particles 3 adhere substantially uniformly over the entire surface of the phosphor particles 2. Therefore, as shown in FIG. 7A, the phosphor particles 2 disposed on the base body 1 adhere via the oxide particles 3, and the phosphor particles 2 stick to each other via the oxide particles 3. These oxide particles 3 serve as a binder that binds the base body 1 and the phosphor particles 2 together, and bind the phosphor particles 2 to each other.

The cover layer 5 is formed by ALD and is composed of alumina. The thickness of the cover layer 5 is 0.5 μm.

Figure 7B:
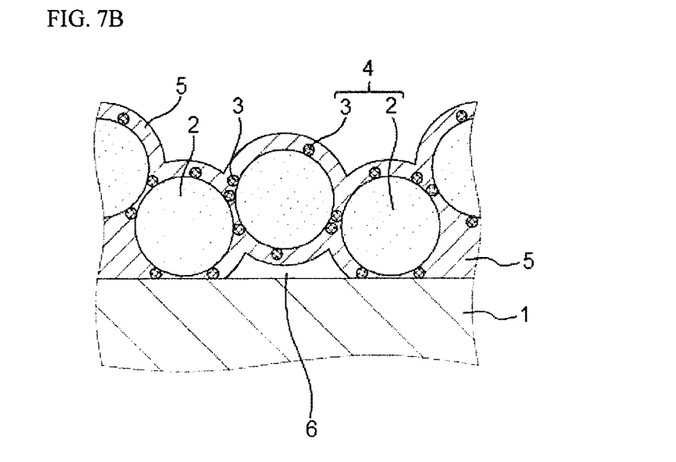

The cover layer 5 covers the entire surface of the phosphor particles 2, including the oxide particles 3 adhering to the surface of the phosphor particles 2. Therefore, unevenness that is mainly attributable to the phosphor particles 2 are formed on the surface of the cover layer 5. Also, in the phosphor layer 4, voids 6 are disposed independently or continuously, as shown in FIG. 7B, in between the phosphor particles 2 and between the base body 1 and the phosphor particles 2, and are disposed via the oxide particles 3. The voids are filled with air.

This wavelength conversion member 10 has a total thickness of about 50 μm at the thickest part.

The wavelength conversion member 10 can function as a transmission type of wavelength conversion member that converts the wavelength of light incident on the phosphor layer 4, and emits light from the face on the opposite side from the incidence face.

With this wavelength conversion member, the oxide particles act as a binder between the phosphor particles themselves and between the phosphor particles and the base body, allowing these to be securely fixed and bound together. In particular, in the case where the oxide particles are smaller than the phosphor particles, this will better ensure enough surface area for them to adhere to the surface of the phosphor particles and/or the base body surface, and will improve adhesion between the phosphor particles themselves and between the phosphor particles and the base body. As a result, the loss, separation, etc., of the phosphor particles due to impact or the like during the manufacturing process can be effectively prevented, and the durability of the phosphor layer can be improved.

Because the oxide particles and the cover layer are made of the same material, internal scatting in the cover layer can be suppressed with the phosphor layer. As a result, this allows the light distribution component to be increased in the direction perpendicular to the upper surface, and at the same time suppresses light heading toward the side surfaces or the lower surface. This further improves the light extraction efficiency.

The phosphor layer that is formed has voids between the phosphor particles. Unevenness that is mainly attributable to the phosphor particles are formed on the surface of this layer. Consequently, light that is incident on the phosphor layer is scattered by the voids and/or surface unevenness, and can be efficiently absorbed by the phosphor particles contained in the phosphor layer. Total reflection at the phosphor layer surface can be reduced, which allows light to be extracted more efficiently from the phosphor layer.

The cover layer that continuously covers the phosphor particles and the oxide particles functions as a protective layer for the phosphor particles, as a binder that strengthens the adhesion of the phosphor particles to the oxide particles or the base body, and as a thermal conduction pathway.

Embodiment 2: Wavelength Conversion Member

Figure 2:
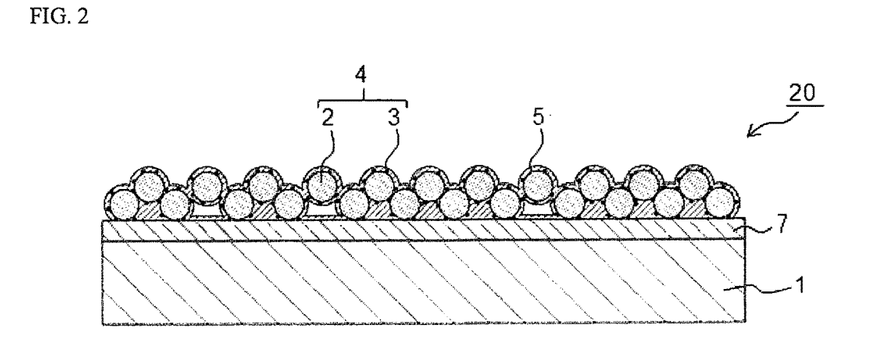
FIG. 2 is a schematic cross section illustrating the configuration of another embodiment of a wavelength conversion member of the present invention.

As shown in FIG. 2, the wavelength conversion member 20 in this embodiment has the same configuration as the wavelength conversion member 10 in Embodiment 1, except that a dielectric multilayer film 7 is formed between the base body 1 and the phosphor layer 4.

With a transmission type of wavelength conversion member, a functional film is formed in which the film thickness and number of laminations are designed so that when light is incident perpendicular to the base body, the optical characteristics will be such that the transmissivity at 400 to 480 nm is at least 90%, and the reflectivity at 520 nm is at least 90%. As a result, return light that has been converted by the phosphor layer 4 and scattered to the base body side is reflected again. Accordingly, return light loss is reduced, and efficiency rises on the emission side. An example of the material of the dielectric multilayer film is a structure in which $Nb_2O_5$ and $SiO_2$ are laminated. Wavelength characteristics can generally be varied by the lamination structure of a material with a high refractive index and a material with a low refractive index.

Embodiment 3: Wavelength Conversion Member

Figure 3:
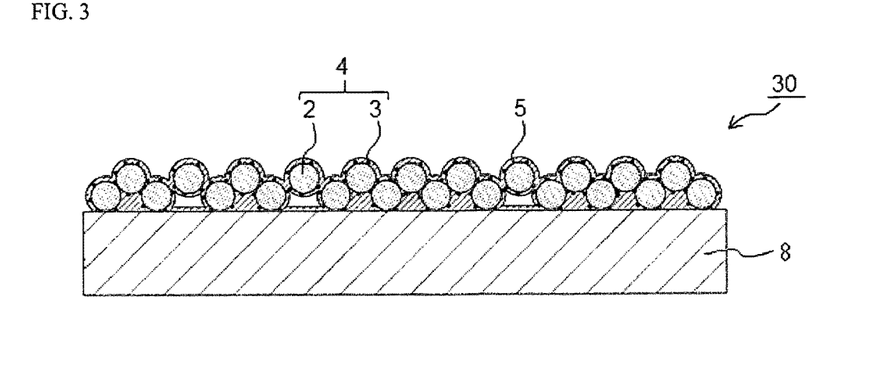
FIG. 3 is a schematic cross sections illustrating the configuration of still other embodiment of a wavelength conversion member of the present invention.

As shown in FIG. 3, the wavelength conversion member 30 in this embodiment has the same configuration as the wavelength conversion member 10 in Embodiment 1, except that a base body 8 composed of aluminum (a metal base body) is used insetead of the sapphire in Embodiment 1.

Thus using a metal base body allows light emitted upward and sideways from the upper surface and side surfaces of the base body to be reflected at the surface of the base body. Consequently, this wavelength conversion member can function as a reflection type of wavelength conversion-use formation member, in which all or part of the light incident from upwards and sideways will be absorbed by the phosphor particles in the phosphor layer, converted into light of a different color from that of the incident light, and reflected.

It is also possible to provide a dielectric multilayer film, a reflective film, or a protective film in between the metal base body and the phosphor layer. The wavelength conversion member will be the same when a reflective film is applied to a light-transmissive base body.

Embodiment 4: Wavelength Conversion Member

Figure 4:
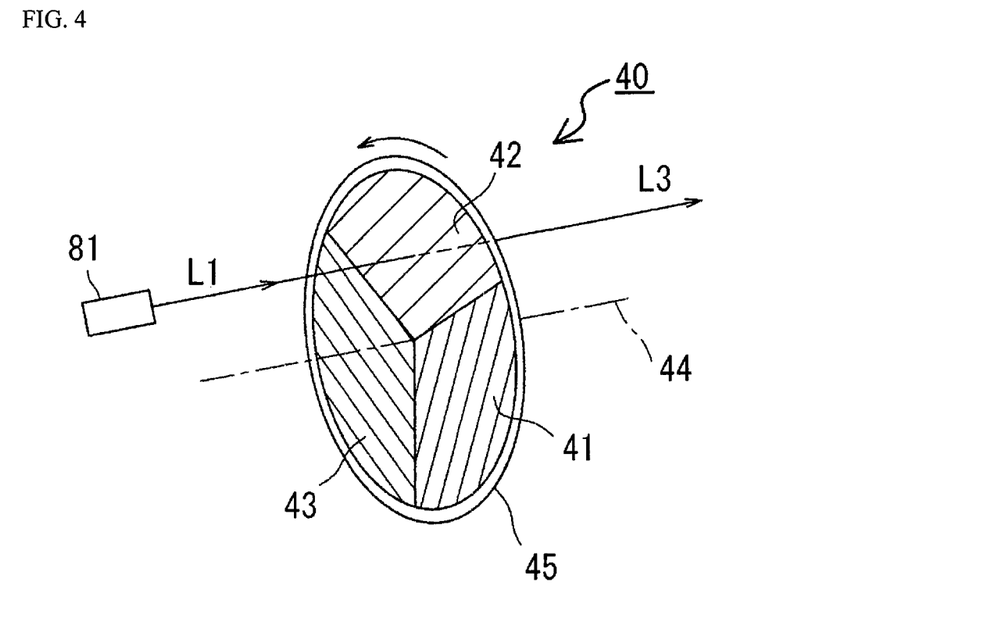
FIG. 4 is a schematic cross sections illustrating the configuration of still other embodiment of a wavelength conversion member of the present invention.

As shown in FIG. 4, the wavelength conversion member in this embodiment is configured as a color wheel 40. This color wheel 40 includes two types of wavelength conversion members 41 and 42 and a light-transmissive member 43 that are disposed within a frame 45, and has a rotary shaft 44 in the center of these. The wavelength conversion members 41 and 42 have substantially the same configuration as the wavelength conversion member 10 in Embodiment 1.

When light L1 emitted from a light emitting element 811 (discussed below) is incident, for example, this color wheel 40 successively outputs three mutually different colors of transmission light L3 as output light as the wheel turns.

Embodiment 5: Wavelength Conversion Member

Figure 5:
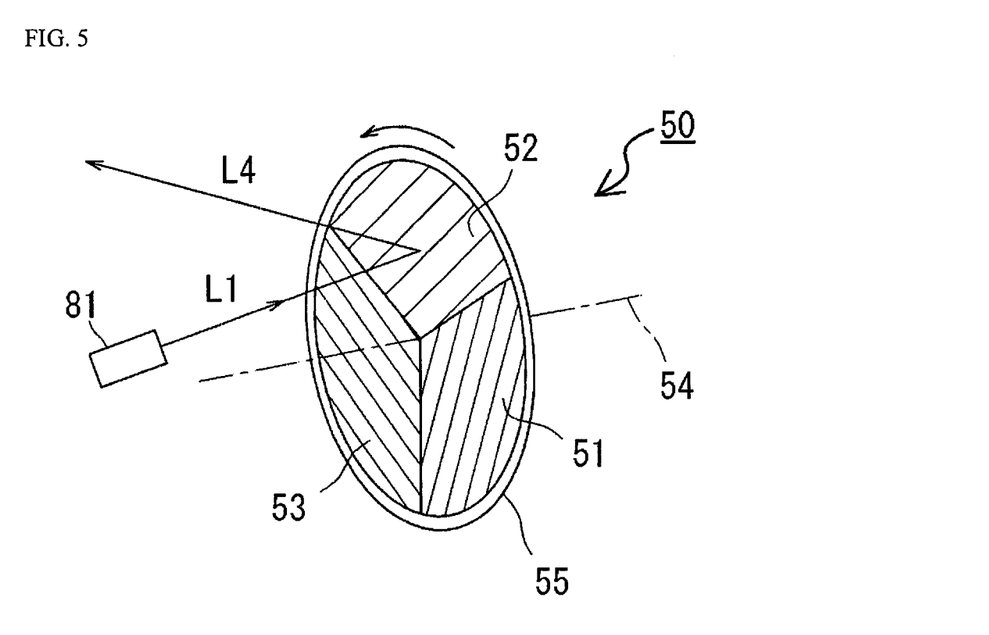
FIG. 5 is a schematic cross sections illustrating the configuration of still other embodiment of a wavelength conversion member of the present invention.

As shown in FIG. 5, the wavelength conversion member in this embodiment is configured as a color wheel 50. This color wheel 50 includes two types of wavelength conversion members 51 and 52 and a light-transmissive member 53 that are disposed within a frame 55, and has a rotary shaft 54 in the center of these. The wavelength conversion members 51 and 52 have substantially the same configuration as the wavelength conversion member 10 in Embodiment 1.

When light L1 emitted from a light emitting element 81 (discussed below) is incident, for example, this color wheel 50 successively outputs three mutually different colors of transmission light L4 as output light as the wheel turns.

Embodiment 6: Method for Manufacturing Wavelength Conversion Member

To form the above-mentioned wavelength conversion member 10, first the above-mentioned phosphor particles 2 and oxide particles 3 were mixed in resin and an organic solvent in a weight ratio of 1:0.01 to 0.02 to prepare a paste.

Figures 6A, 6B:
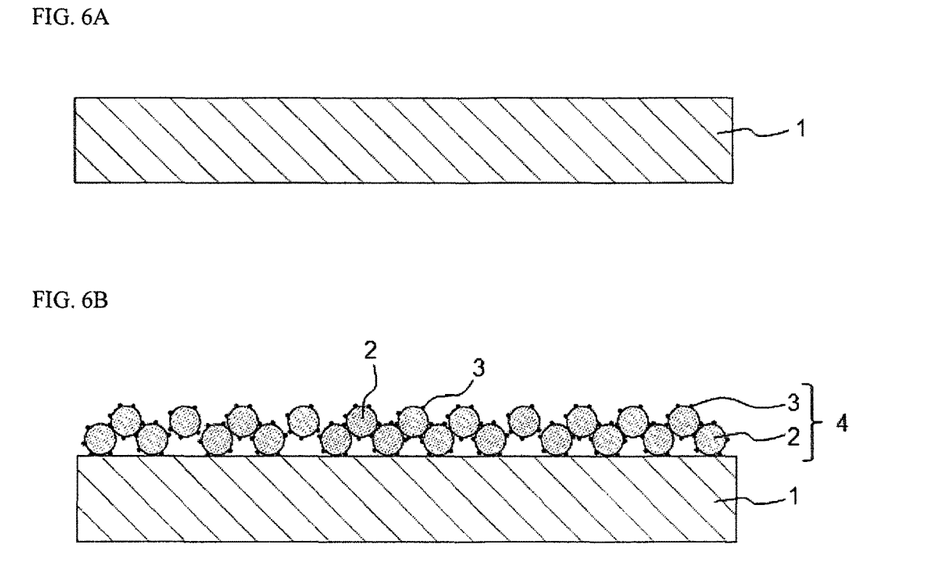
FIGS. 6A to 6C are schematic cross sectional views illustrating the steps for manufacturing the wavelength conversion member of an embodiment of the present invention.

The base body 1 was prepared as shown in FIG. 6a.

Next, the prepared paste is applied by printing over the base body 1 in a thickness of about 50 μm. After this, the resulting base body 1 is put in a 170° C. oven for between 30 and 60 minutes to evaporate off the solvent component of the paste. After the solvent component has been removed, sintering is performed. The resin component is removed by sintering for 30 to 60 minutes at 500° C. After the sintering step, as shown in FIG. 7A, the oxide particles 3 are distributed over the surface of the phosphor particles 2, and adhere substantially uniformly. Consequently, the oxide particles 3 effectively act as a binder between the base body 1 and the phosphor particles 2, and effectively prevent the loss, separation, and so forth of the phosphor particles due to impact or the like during the manufacturing process.

The phosphor layer 4 is formed on the base body 1 by this series of steps as shown in FIG. 6b.

Figure 6C:
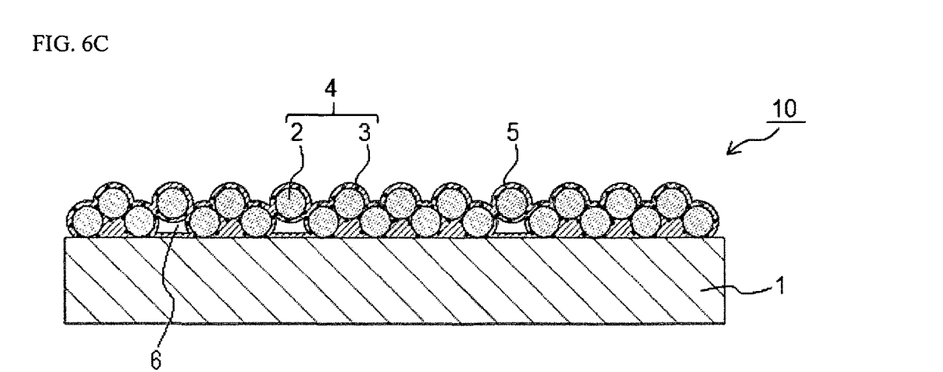

Then, as shown in FIG. 6c, the cover layer 5 is formed as an $Al_2O_3$ film by ALD, for example.

The base body 1 on which the phosphor layer 4 has been formed is put into the reaction vessel of an ALD apparatus. The pressure inside the reaction vessel is adjusted to 10 Torr (13,332 Pa), for example. At a temperature of 150° C., nitrogen gas is introduced into the reaction vessel ahead of time. The flow of the nitrogen gas is set at 20 sccm, and maintained for 60 minutes. After this, $H_2O$ is introduced for 0.015 second as a first raw material into the reaction vessel. A stop valve that connects the reaction vessel with a vacuum line is closed to make the $H_2O$ react with the surface of the phosphor layer and the base body, and the surface of the phosphor layer is exposed to the $H_2O$ for 15 seconds. The stop valve is opened and the unreacted $H_2O$ and by-products are flushed from the reaction vessel for 60 seconds by a nitrogen gas flow.

Next, TMA is introduced as a second raw material into the reaction vessel for 0.015 second. The stop valve of the reaction vessel is closed to make the TMA react with the surface of the phosphor layer, and the surface of the phosphor layer is exposed to the TMA for 15 seconds. The stop valve is opened and the unreacted TMA and by-products are flushed from the reaction vessel for 60 seconds by a nitrogen gas flow.

One cycle here is from the introduction of the first raw material until the flushing out of the second raw material, and this cycle is repeated until an $Al_2O_3$ film of the desired thickness has been formed. For example, in 6000 cycles the $Al_2O_3$ film is deposited one molecule at a time, and an $Al_2O_3$ film with a thickness of 1 μm can be formed as shown in FIG. 7B.

Upon completion of the film formation, the stop valve is closed, the nitrogen gas flow is adjusted to 100 sccm, and the pressure inside the reaction vessel is brought to normal pressure, after which the base body is taken out.

This cover layer 5 continuously covers the surface of the base body 1, the surface of the oxide particles 3, and the surface of the phosphor particles 2, and also forms independent or continuous voids 6 within the phosphor layer 4.

Another method besides ALD for forming a cover layer is a sol-gel method.

The base body 1 on which the phosphor layer 4 has been formed is picked up by the vacuum of spin coating from the side without the phosphor, and a dropper is used to coat the phosphor with a solution containing tetraethoxysilane. The applied solution spreads into the voids of the cover layer through capillary action.

Once the whole surface of the phosphor layer has been coated with the solution, any excess solution is spun off with the spin coater. The product is then held for 30 minutes in an air atmosphere at 150° C., the solvent is volatilized, hydrolysis and polycondensation of the solvent is promoted, and the surfaces of the phosphor particles, the oxide particles, and the base body are covered by a solid component. Next, this product is held for 1 hour in an air atmosphere at 500° C. to further cure the solid component. After this, the temperature is lower to normal temperature by natural cooling.

The thickness of the cover layer can be adjusted by the residual amount of solvent. Also, a thick cover layer may be formed by repeating the steps.

Embodiment 7: Light Emitting Device

Figure 8:
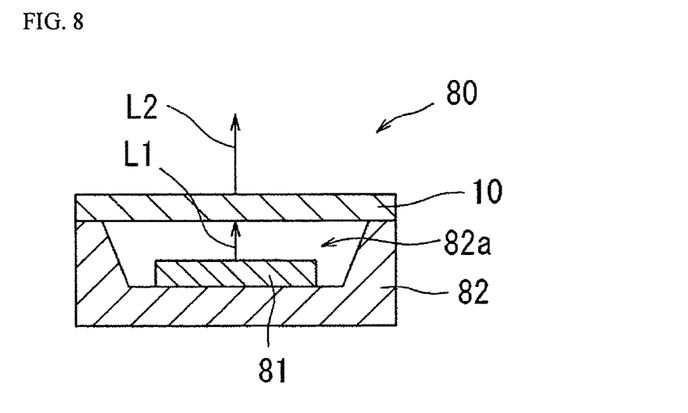
FIG. 8 is a schematic cross section of an embodiment of the light emitting device of the present invention.

As shown in FIG. 8, the light emitting device 80 in this embodiment may include a light emitting element 81 and a wavelength conversion member 10.

The light emitting element 81 is composed of aluminum nitride, and is mounted on a sub-mount 82 equipped with a recess 82a in its center.

With this light emitting device 80, the light L1 emitted from the light emitting element 81 is incident on the wavelength conversion member 10. At the wavelength conversion member 10, the light L1 is absorbed by the phosphor particles, and is then emitted as light L2 whose wavelength has been converted.

With this light emitting device, the light incident on the wavelength conversion member propagates through the phosphor layer while being scattered by the voids in the phosphor layer, and is emitted as transmitted light from the face on the opposite side from the face where the light was incident. This transmitted light becomes the output light from the light emitting device.

The wavelength conversion member provided to the light emitting device is such that the oxide particles help the phosphor particles to adhere securely to the base body or to other phosphor particles, and the surface of the phosphor particles that contain these oxide particles is covered by the cover layer, so the phosphor layer can be affixed more securely to the base body. Also, optical and thermal degradation due to the effect of heat generation and the like in the drive of the light emitting element and to the heating performed in the manufacturing process can be suppressed, and good wavelength conversion characteristics can be maintained over an extended period.

Modified Embodiment 7: Light Emitting Device

The light emitting device in this embodiment may include a light emitting element 81 and a color wheel 40 or 50 instead of the wavelength conversion member 10 of the light emitting device 80. This light emitting device is useful for, in particular, a light source of projector.

What is claimed is:
1. A method for manufacturing a wavelength conversion member comprising:
    mixing phosphor particles and oxide particles into an organic solvent and a resin to prepare a mixture, coating the mixture on a base body, and removing the organic solvent and the resin to form a phosphor layer on the base body, the phosphor layer including the phosphor particles and the oxide particles affixed to surfaces of the phosphor particles, the oxide particles having at least one oxide particle that is affixed to two phosphor particles therebetween; and
    forming a cover layer covering the surfaces of the phosphor particles which includes the two phosphor particles that are connected via the at least one oxide particle and surfaces of the oxide particles continuously, the cover layer having a same oxide material as the oxide particles.
2. The method for manufacturing the wavelength conversion member according to claim 1, wherein
    the forming of the phosphor layer includes applying the mixture by printing over the base body.
3. The method for manufacturing the wavelength conversion member according to claim 1, wherein
    the oxide particles have a smaller particle size than the phosphor particles.
4. The method for manufacturing the wavelength conversion member according to claim 1, wherein
    the phosphor particles have an average size of 0.1 to 50 μm, and the cover layer has an average thickness of 1 nm to 50 μm.
5. The method for manufacturing the wavelength conversion member according to claim 1, wherein
    the cover layer is made from at least one of $Al_2O_3$, $SiO_2$, $ZrO_2$, $HfO_2$, $TiO_2$, ZnO, $Ta_2O_5$, $Nb_2O_5$, $In_2O_3$ and $SnO_2$.
6. The method for manufacturing the wavelength conversion member according to claim 1, wherein
    the forming of the cover layer includes forming the cover layer by ALD.
7. The method for manufacturing the wavelength conversion member according to claim 1, wherein
    the forming of the cover layer includes forming the cover layer by sol-gel method.
8. The method for manufacturing the wavelength conversion member according to claim 1, further comprising forming a void between the base body and the phosphor layer, or between the base body and the cover layer.

9. The method for manufacturing the wavelength conversion member according to claim 1, wherein
the forming of the cover layer includes forming, as the cover layer, a layer that is continuously formed of a single type of oxide material.

10. The method for manufacturing the wavelength conversion member according to claim 1, wherein
the forming of the cover layer includes forming the cover layer by an atomic layer deposition method, a metalorganic chemical vapor deposition method, a plasma-enhanced chemical vapor deposition method, a chemical vapor deposition method, an atmospheric-pressure plasma film-forming method, a spattering method or a deposition method.

11. The method for manufacturing the wavelength conversion member according to claim 1, wherein
the phosphor layer is formed such that the oxide particles affix to the surfaces of the phosphor particles substantially uniformly in three-dimensional directions of the phosphor particles after the organic solvent and the resin are removed.

12. The method for manufacturing the wavelength conversion member according to claim 1, wherein
The phosphor layer is formed such that part of the oxide particles are arranged between the phosphor particles and the base body after the organic solvent and the resin are removed.

* * * * *